United States Patent [19]
Samukawa

[11] Patent Number: 5,401,351
[45] Date of Patent: Mar. 28, 1995

[54] RADIO FREQUENCY ELECTRON CYCLOTRON RESONANCE PLASMA ETCHING APPARATUS

[75] Inventor: Seiji Samukawa, Tokyo, Japan
[73] Assignee: NEC Corporation, Tokyo, Japan
[21] Appl. No.: 187,392
[22] Filed: Jan. 27, 1994
[30] Foreign Application Priority Data
Jan. 27, 1993 [JP] Japan .................. 5-029613
[51] Int. Cl.6 ............................ H01L 21/00
[52] U.S. Cl. .................. 156/345; 156/643; 204/298.31; 118/723 AN
[58] Field of Search .............. 156/345, 643; 118/723 AN; 204/298,37, 298.31

[56] References Cited
U.S. PATENT DOCUMENTS

| 4,996,077 | 2/1991 | Moslehi et al. | 118/722 X |
| 5,081,398 | 1/1992 | Asmussen et al. | 315/111.41 |
| 5,280,154 | 1/1994 | Cuomo et al. | 156/345 X |

FOREIGN PATENT DOCUMENTS
56-155535 12/1981 Japan .
60-134423 7/1985 Japan .

Primary Examiner—R. Bruce Breneman
Assistant Examiner—Jonathan D. Baskin
Attorney, Agent, or Firm—Popham, Haik, Schnobrich & Kaufman, Ltd.

[57] ABSTRACT

A radio frequency electron cyclotron resonance (RF-ECR) plasma etching apparatus in which electron cyclotron resonance is caused to occur by radio frequency waves of 100–500 MHz introduced in by an antenna. The antenna is disposed within a plasma-producing chamber and connected to a coaxial cable for introducing the radio frequency waves. A plurality of permanent magnets are provided for producing magnetic fields that perpendicularly intersect electric fields produced around the antenna within the plasma-producing chamber. A process gas forms plasma to the electron cyclotron resonance phenomena resulting from the electric fields generated by the radio frequency waves and the magnetic fields perpendicularly intersecting the electric fields in the plasma-producing chamber. The plasma thus produced is applied to the substrate for etching.

7 Claims, 3 Drawing Sheets

RADIO FREQUENCY ELECTRON CYCLOTRON RESONANCE PLASMA ETCHING APPARATUS

BACKGROUND OF THE INVENTION (1) Field of the Invention

The present invention relates to an etching apparatus, and more particularly to a radio frequency electron cyclotron resonance (RF-ECR) plasma etching apparatus for use in etching a surface of a wafer or a substrate with the plasma produced by utilization electron cyclotron resonance phenomena.

(2) Description of the Related Art

There are two examples of conventional microwave plasma etching apparatuses to which the present invention relates.

One such etching apparatus shown in FIG. 1 is disclosed in Japanese Patent Application Kokai Publication No. Sho 56-155535. In this apparatus, an ething object 101 is set where the electron cyclotron resonance discharge caused by microwaves 102 takes place for etching. In FIG. 1, a plasma-producing chamber is designated by numeral 103, a microwave inlet window by numeral 104, a waveguide by numeral 105, a gas inlet port by numeral 107, an electron cyclotron resonance point by numeral 109, and a substrate holder by numeral 110.

The other example shown in FIG. 2 is disclosed in Japanese Patent Application Kokai Publication No. Sho 60-134423. In this apparatus, a reaction gas is introduced into a plasma-producing chamber 201, and a reactive gas plasma is produced by the reaction of both the microwaves and the magnetic field in the plasma-producing chamber 201. By utilizing the divergent magnetic field generated by a magnetic coil, the produced reactive gas plasma is introduced into a reaction chamber 202 where the substrate 203 to be etched is placed. In FIG. 2, a solenoid coil for generating the divergent magnetic field is designated by numeral 204, a microwave inlet window by numeral 205, a waveguide by numeral 206, a microwave source by numeral 207, a gas inlet duct by numeral 208, an electron cyclotron resonance point by numeral 209, a substrate holder by numeral 210, a plasma introduction window by numeral 211, and an exhaust duct by numeral 212.

However, in each of the above conventional apparatuses, a microwave emission of 2.45 GHz is used thereby requiring a waveguide and, in order to cause the resonance to occur, a magnetic field intensity in the order of 900 Gausses is required. One of the problems therefore is that the apparatus inevitably becomes large and complex. Also, there are difficulties in uniformly introducing microwaves and in uniformly producing plasma. Furthermore, since the magnetic line of force is applied perpendicular to the substrate, there are problems involving occurrence of potential distribution or difficulties in the uniform application of radio frequency bias to the substrate.

SUMMARY OF THE INVENTION

It is, therefore, an object of the present invention to overcome the problems existing in the conventional apparatuses and to provide a radio frequency electron cyclotron resonance plasma etching apparatus in which electron cyclotron resonance is caused to occur utilizing radio frequency waves of 100–500 MHz introduced by means of an antenna.

According to one aspect of the present invention, there is provided a radio frequency electron cyclotron resonance plasma etching apparatus comprising:

a plasma-producing chamber for etching a substrate therein;

a coaxial cable for introducing radio frequency waves for discharging within the plasma-producing chamber;

an antenna disposed within the plasma-producing chamber and electrically connected to the coaxial cable; and a plurality of permanent magnets for producing plasma by applying magnetic fields that perpendicularly intersect electric fields produced around the antenna within the plasma-producing chamber, wherein a process gas is caused to become plasmic by utilizing electron cyclotron resonance phenomena to develop based on the electric fields generated by the radio frequency waves and the magnetic fields for plasma production perpendicularly intersecting the electric fields in the plasma-producing chamber and the plasma thus produced is applied to the substrate for etching, and wherein a radio frequency of 100–500 MHz is used.

In the apparatus according to the invention, since the radio frequency waves are used and the magnetic field intensity necessary for the resonance to occur becomes 35–180 Gausses, the magnets used may be compact permanent magnets. Also, since the radio frequency waves can be introduced by the antenna, it is possible to make the apparatus compact and to facilitate easy realization of uniform magnetic fields. Furthermore, by applying the magnetic lines of force in parallel to the substrate, it is possible to ensure the uniform application of the radio frequency bias to the substrate.

BRIEF DESCRIPTION OF THE DRAWINGS

The above and other objects, features and advantages of the present invention will be apparent from the following description of a preferred embodiment of the invention explained with reference to the accompanying drawings, in which.

PREFERRED EMBODIMENT OF THE INVENTION

Now, a preferred embodiment of the invention will be explained with reference to the accompanying drawings.

Figure 1:
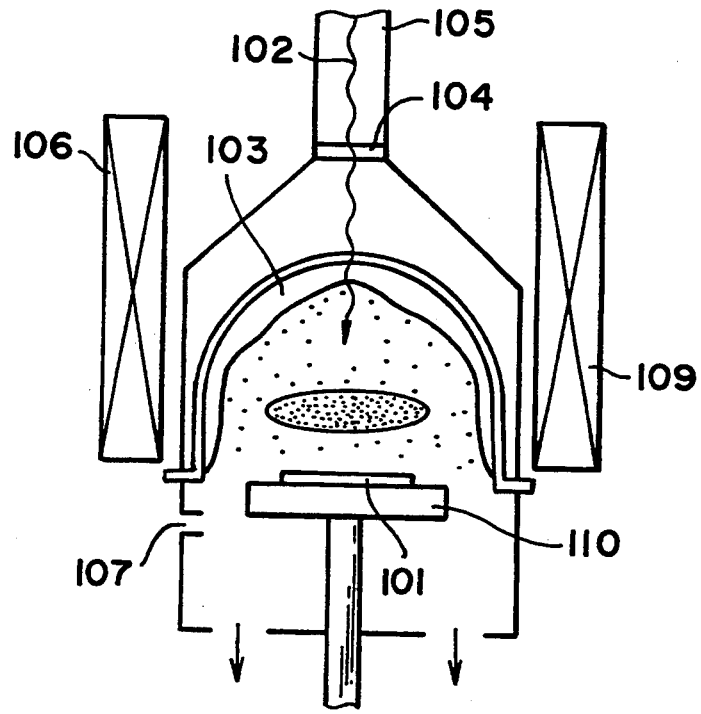
FIG. 1 is a diagram showing a structure of an example of a conventional microwave plasma etching apparatus.
Figure 2:
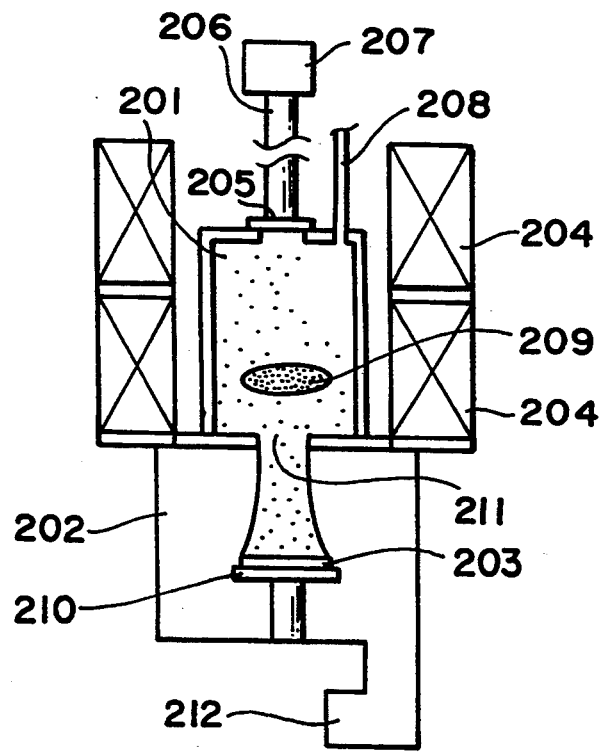
FIG. 2 is a diagram showing a structure of another example of a conventional microwave plasma etching apparatus.
Figure 3:
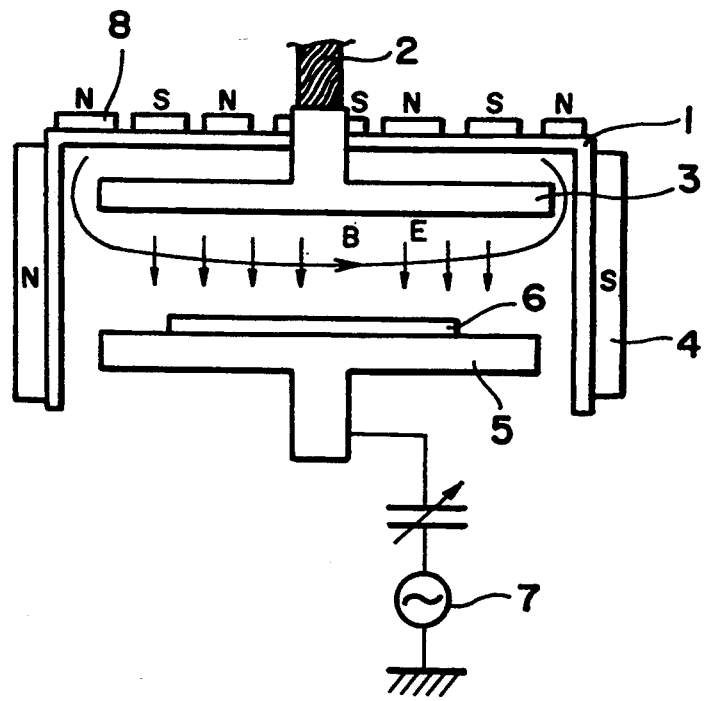
FIG. 3 is a diagram showing a structural of a radio frequency electron cyclotron resonance plasma etching apparatus according to the present invention.
Figure 5:
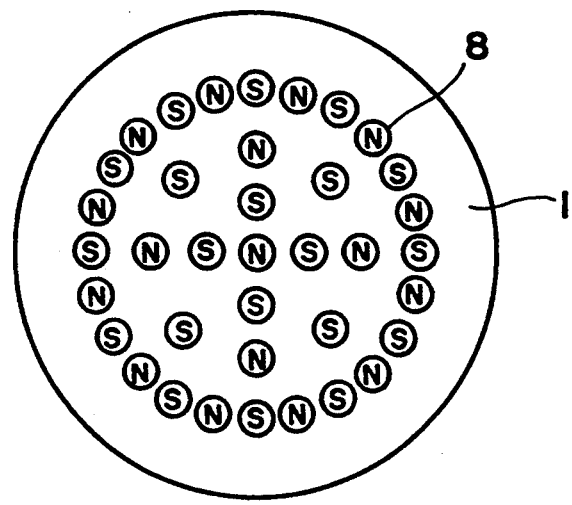
FIG. 5 is a top view showing locations of permanent magnets on a plasma-producing chamber.
Figure 4A:
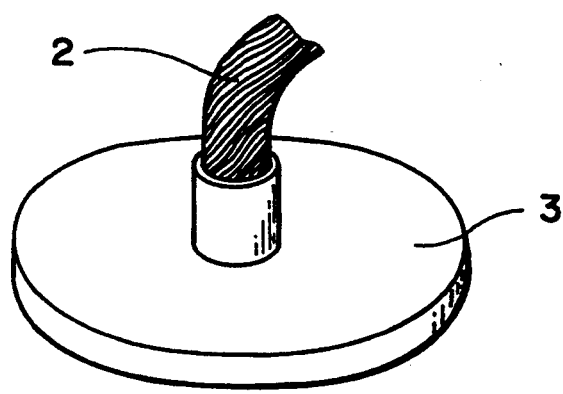
FIG. 4A is a perspective view showing a radio frequency wave antenna of a disk form for plasma discharging used in the apparatus according to the invention.
Figure 4B:
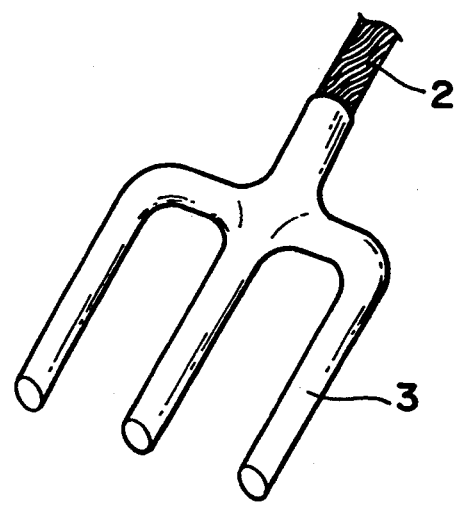
FIG. 4B is a perspective view showing a radio frequency wave antenna of a fork form for plasma discharging used in the apparatus according to the invention.

FIG. 3 shows a configuration of an example of the RF-ECR plasma etching apparatus according to the invention. The apparatus is provided with a plasma-producing chamber 1 and a substrate-transporting chamber (not shown) disposed adjacent to each other, the plasma-producing chamber 1 being for producing plasma by electron cyclotron resonance. The plasma-producing chamber 1 is connected to a gas system (not shown) which introduces a gas for producing plasma, and is provided with a coaxial cable 2 which introduces radio frequency waves for discharging and an antenna (electrode) 3. The antenna 3 may be in a disk form as shown in FIG. 4A or in a fork form as shown in FIG. 4B. The electron cyclotron resonance occurs based on an electric field introduced in from the antenna (electrode) 3 and a magnetic field from the permanent magnets 8 provided at the top of the plasma-producing chamber 1. As shown in FIG. 5, the permanent magnets 8 are provided in such a way that N poles and S poles alternate with one another and the movement of the electrons is in a loop. As a result, the magnetic lines of force are applied in parallel to the substrate 6 on a substrate holder 5 and the resonance magnetic field is uniformly produced at a location about 2 cm off the antenna (electrode) 3. The plasma thus produced is confined in a cusp field formed by a plurality of magnets 4 located around the periphery of the plasma-producing chamber 1. The plasma is thus spread and transported to the substrate while its density is maintained. The substrate 6 is applied with a radio frequency bias supplied from a radio frequency source 7, of several hundreds of KHz to 13.56 MHz for controlling ion energies.

As explained above, in the RF-ECR plasma etching apparatus according to the present invention, since the radio frequency waves can be introduced into the plasma-producing chamber by the antenna, such introduction can be made uniformly in the plasma chamber having an inlet opening of a large diameter thereby enabling uniform plasma production. Also, since the coaxial cable can be used for the introduction of the radio frequency waves into the plasma-producing chamber without requiring waveguides or air-core coils and, furthermore, a low magnetic field is sufficient, the apparatus can be made compact and simple. Also, the magnetic line of force is applied in parallel to the substrate to be etched, which enables the radio frequency bias to be applied uniformly and which results in the realization of highly precise etching.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A radio frequency electron cyclotron resonance plasma etching apparatus comprising:
   a plasma-producing chamber for etching a substrate therein;
   a coaxial cable for introducing radio frequency waves for discharging within said plasma-producing chamber;
   an antenna disposed within said plasma-producing chamber and electrically connected to said coaxial cable; and
   a plurality of permanent magnets for producing plasma by applying magnetic fields that perpendicularly intersect electric fields produced around said antenna within said plasma-producing chamber,
   wherein a process gas is caused to become plasmic by utilizing electron cyclotron resonance phenomena to develop based on the electric fields generated by the radio frequency waves and the magnetic fields for plasma production perpendicularly intersecting said electric fields in said plasma-producing chamber and the plasma thus produced is applied to the substrate for etching, and wherein a radio frequency of 100–500 MHz is used.

2. A radio frequency electron cyclotron resonance plasma etching apparatus according to claim 1, in which said plurality of permanent magnets are such that their magnetic lines of force are applied in parallel to said substrate.

3. A radio frequency electron cyclotron resonance plasma etching apparatus according to claim 1, in which said plasma-producing chamber is provided at its periphery with a plurality of magnets for producing magnetic fields which confine the plasma therein.

4. A radio frequency electron cyclotron resonance plasma etching apparatus according to claim 2, in which said plasma-producing chamber is provided at its periphery with a plurality of magnets for producing magnetic fields which confine the plasma therein.

5. A radio frequency electron cyclotron resonance plasma etching apparatus according to claim 1, in which said plurality of permanent magnets are provided in such that N poles and S poles alternate with one another and motion of electrons takes a loop form.

6. A radio frequency electron cyclotron resonance plasma etching apparatus according to claim 1, in which said antenna has a disk like configuration.

7. A radio frequency electron cyclotron resonance plasma etching apparatus according to claim 1, in which said antenna has a fork like configuration.

* * * * *